United States Patent [19]

Kitamura et al.

[11] Patent Number: 4,680,250

[45] Date of Patent: Jul. 14, 1987

[54] COMPOSITE ALUMINUM SHEET FOR PRESENSITIZED LITHOGRAPHIC PRINTING PLATE COMPRISING A SUPPORT HAVING SPECIFIED CENTER LINE AVERAGE ROUGHNESS

[75] Inventors: Hironori Kitamura, Nagaokakyo; Kanji Noma, Osaka, both of Japan

[73] Assignee: Nippon Foil Manufacturing Co., LTd., Japan

[21] Appl. No.: 801,502

[22] Filed: Nov. 25, 1985

Related U.S. Application Data

[63] Continuation of Ser. No. 541,778, Oct. 13, 1983, abandoned.

[30] Foreign Application Priority Data

Dec. 6, 1982 [JP] Japan ................................ 57-214527

[51] Int. Cl.$^{4}$ ............................ G03F 7/02; G03C 1/76

[52] U.S. Cl. .................................... 430/302; 101/456; 101/459; 430/157; 430/165; 430/276; 430/278; 430/961

[58] Field of Search ............... 430/276, 278, 302, 165, 430/157, 961; 101/456, 459

[56] References Cited

U.S. PATENT DOCUMENTS

| | | | |
|---|---|---|---|
| 2,528,395 | 10/1950 | Slifkin | 430/157 X |
| 2,602,741 | 7/1952 | Grinten et al. | 430/157 X |
| 3,161,517 | 12/1964 | Doggett | 430/276 X |
| 3,295,977 | 1/1967 | Deziel | 430/157 X |
| 4,301,229 | 11/1981 | Sakaki et al. | 430/158 |
| 4,376,159 | 3/1983 | Spechler | 430/165 X |
| 4,387,157 | 6/1983 | Bronstert et al. | 430/276 X |
| 4,427,500 | 1/1984 | Platzer | 430/157 X |

*Primary Examiner*—John E. Kittle
*Assistant Examiner*—Mukund J. Shah
*Attorney, Agent, or Firm*—Lyon & Lyon

[57] ABSTRACT

A composite aluminum sheet for a presensitized lithographic printing plate comprises a support such as a thermoplastic sheet and an aluminum foil which has a matt surface with a roughness of 0.20–0.65 $\mu m$ $R_a$ on one side thereof and is prepared by twice or more repeatedly pack rolling doubled aluminum foils, the support being overlaid with the aluminum foil so that the matt surface thereof faces outside. A presensitized plate for lithography having excellent printing properties such as printing runnability can be prepared from the composite aluminum sheet.

8 Claims, 5 Drawing Figures

COMPOSITE ALUMINUM SHEET FOR PRESENSITIZED LITHOGRAPHIC PRINTING PLATE COMPRISING A SUPPORT HAVING SPECIFIED CENTER LINE AVERAGE ROUGHNESS

This application is a continuation of application Ser. No. 541,778, filed Oct. 13, 1983, now abandoned.

The present invention relates to a composite aluminum sheet for a presensitized lithographic printing plate as well as a presensitized plate prepared therefrom.

An aluminum foil is fit for almost all requirements for a supporting substrate of a presensitized plate, for example smoothness, hydrophilicity, dimensional stability, adhesion to a photosensitive coating or the like.

From such a viewpoint, an aluminum sheet of monolayer structure with a thickness of e.g. 100–300 μm has hitherto been utilized as a substrate of a presensitized plate, as well known for those skilled in the art. It is evidently understood, however, that a thinner foil of aluminum may be more preferable from the viewpoint of saving of expensive material or economy.

A composite sheet comprising a paper sheet or a plastic film as a substantially supporting substrate and a thinner foil of aluminum will satisfy such an economical requirements. For example, Japanese Patent Publication No. 22261/64 proposed a composite lithographic plate which comprised an aluminum foil firmly bonded by a plastic film to a paper sheet support. The foil of aluminum, however, had a thickness of 0.254–0.762 mm and was not preferable in view of economy. Another composite backing sheet for a lithographic printing plate was proposed by Edward W. Deziel in Japanese Patent Publication No. 3759/63. The proposed composite sheet comprised two aluminum foils and a thin paper sheet support therebetween, each aluminum foil having a thickness of about 9–64 μm.

The proposed composite sheet by E. W. Deziel was also impractical although it had the advantages of aluminum as above-mentioned, because a printing plate comprising such a composite sheet as disclosed in the Patents was defective in a certain printing property which is required for a lithographic printing plate. The "printing property" herein means an endurance of such a printing plate while retaining other printing properties such as tone reproduction and printability due to its superior water reception characteristics when it is subjected to a number of runs of printing operation, for example ten thousand or even fifty thousand or more runs in some cases, this printing property being hereinafter referred to "printing runnability".

The inventors found that a lithographic printing plate having an improved printing runnability could be obtained from an aluminum foil with a matt surface. A matt surface of an aluminum foil has been known for those skilled in the art of rolling technique to be obtained by a pack rolling process of doubled foils wherein two or more foils of aluminum are doubled, rolled together and thereafter separated into individual foils which have a matt surface. In the course of investigations of such an aluminum foil, the inventors found that a single pack rolling process of doubled foils could give only surface roughness insufficient for a substrate of a lithographic printing plate with such a high printing runnability.

It has now been found that the printing runnability of a lithographic printing plate is severely dependent upon a surface roughness of an aluminum foil, and the inventors have finally discovered that such an aluminum foil capable of providing a printing plate to be prepared therefrom with an excellent printing runnability can be obtained by twice or more repeating the pack rolling process of doubled aluminum foils, that is, once pack-rolled and separated foils of aluminum are again doubled, rolled together (pack-rolled) and then separeted into final product foils of aluminum which have a matt surface suitable for preparing a presensitized lithographic printing plate with a high printing runnability.

In a conventional pack rolling process of doubled foils, although a roughness of upto only about 0.2 μm $R_a$ could be obtained, it was nonetheless difficult to obtain a roughness of more than 0.2 μm $R_a$ even if the pack rolling conditions such as a roll pressure and a reduction per pass was significantly changed. The inventors have found that a roughness of an aluminum foil of 0.20–0.65 μm $R_a$ can be obtained by repeating twice or more the pack rolling process of doubled aluminum foils and an obtained aluminum foil has a sufficiently excellent surface property for preparing a lithographic printing plate with such a high printing runnability as mentioned above.

It is an object of the present invention to provide a composite aluminum sheet suitable for preparing a presensitized lithographic printing plate having an excellent printing runnability.

An another object of the invention is to provide a presensitized plate for lithography with an excellent printability.

These and other objects of the present invention will be apparent for those skilled in the art from the following detailed description and attached drawings.

The composite sheet of the invention comprises a support and an aluminum foil which has a matt surface with a roughness of 0.20–0.65 μm $R_a$. The surface roughness of the aluminum foil may be obtained by twice or more repeatedly pack rolling doubled aluminum foils in the invention.

The presensitized plate for lithography of the invention comprises the composite sheet of the invention, an anodized layer and a photosensitive coating. The plate may be prepared by any known process generally used for preparation of a conventional presensitized plate.

The present invention will be described hereinafter in more detail while referring to the attached drawings. Among the drawings.

Figure 1:
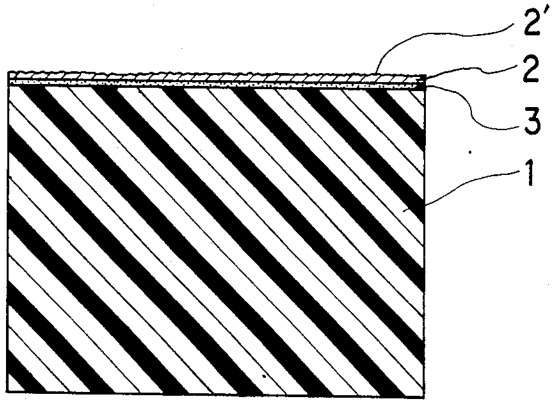
FIG. 1 shows an example of the composite sheet of the present invention.

FIG. 1 is a cross sectional view of an embodiment of the composite sheet of the present invention which illustrates the construction of the composite sheet. The composite sheet of the invention comprises a support 1 and a thin aluminum foil 2. The aluminum foil 2 is firmly bonded to the support 1 by an adhesive layer 3.

A material for the support 1 of the composite sheet of the invention may be selected from any conventional material known in the art for a supporting substrate of a printing plate according to the use and/or object of the composite sheet and/or a presensitized plate to be prepared therefrom. In the invention, a paper sheet which is water-proof such as a high wet-strength natural Kraft paper, a synthetic paper such as Yupo (manufactured by Oji Yuka Synthetic Paper Co., Ltd.), a metal sheet such as iron foil or a plastic film may be used for the support 1. A sheet of thermoplastic resin such as polyethylene terephthalate, polypropylene, oriented polypropylene, polyethylene, polyvinyl alcohol, polyvinyl chloride, ethylene-vinyl acetate copolymer, ionomer or the like may be preferably used. The thickness of the support 1 may be suitably selected from a wide range of thickness depending on the use and/or object of the composite sheet and/or a presensitized plate to be prepared therefrom in the invention.

The term "aluminum" herein used may include pure aluminum with a purity of 99% or more and an aluminum alloy with aluminum content of about 95% or more, for example JIS A 3003, 3304, 1202 or 1100, which may be appropriately selected depending on the use and/or object of the composite sheet and/or a presensitized plate to be prepared therefrom in the invention. The thickness of the aluminum foil 2 is 7–80 μm, preferably 10–80 μm and may be suitably selected according to the use and/or object of the composite sheet and/or a presensitized plate to be prepared therefrom.

The adhesive layer 3 may be used for firmly adhering the aluminum foil 2 to the support 1. An adhesive to be used in the invention may be any conventional one known to those skilled in the art such as a thermoplastic resin, for example polyethylene, ionomer, polyurethane or the like. The thickness of the adhesive layer 3 is generally 2–20 μm in the invention.

The main characteristic feature of the present invention is a specific surface roughness of the aluminum foil 2. The surface roughness of the aluminum foil 2 in the invention means a center-line mean roughness ($R_a$) measured by an instrument for the measurement of surface roughness by the stylus method (JIS B 0651) according to JIS B 0601-1982.

The surface roughness of the aluminum foil 2 of the invention is 0.20–0.65, preferably 0.45–0.65 μm $R_a$. In the present invention, the outer side 2' of the aluminum foil 2 is to have such a roughness.

The inventors have found that the roughness of the outer surface 2' can enhance the adhesion of the aluminum foil to the photosensitive coating hereinafter mentioned (see FIG. 5) and as a result a presensitized plate prepared from such a composite sheet has an excellent printing runnability, that is, such a plate retains its good printing properties such as tone reproduction, printability and the like when the plate is subjected to many runs of printing operation, for example ten thousand or, if desired, fifty thousand or more runs.

In the present invention, the printing runnability of about ten thousand runs endurance can be obtained with a foil having a surface roughness of from 0.2 to about 0.45 μm $R_a$. However, a surface roughness of 0.45–0.65 μm $R_a$ of the aluminum foil may be preferable since such a roughness enables the obtainment of the printing runnability of about fifty thousand or more runs endurance.

Such a roughness can be obtained by a special rolling technique according to the invention, that is twice or more repeated pack rolling process of doubled aluminum foils.

Figure 2:
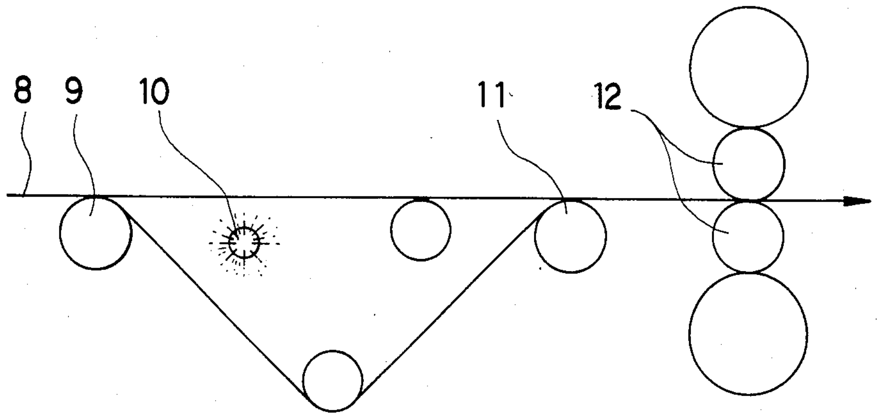
FIG. 2 is a schematic illustration of a part of the pack rolling process for preparation of an aluminum foil according to the present invention.

FIG. 2 shows a part of pack rolling process according to the present invention. In the typical pack rolling process of the invention, first of all, two aluminum foils with a thickness of e.g. about 30–200 μm are doubled. The aluminum foil to be pack rolled has been prepared by any conventional rolling process from an aluminum strip with a thickness of e.g. 0.4–0.5 mm. And the doubled aluminum foils are then rolled together (pack-rolled) under the suitable conditions, for example roll load of 100–250 kg per mm of width of a roll in contact with the foils, rolling speed of 100–800 m/min, reduction per pass of 20–65%, choice of rolling oil and additive(s) or the like, those skilled in the art being able to select best suitable conditions depending onto a thickness of an aluminum foil to be desired. The once pack rolled foils of aluminum are then separated into two individual foils followed by subjecting to an intermediate annealing, if desired. Subsequently, the two individually separated aluminum foils are again doubled and subjected to the second pack rolling operation. In the second pack rolling operation, as shown in FIG. 2, the doubled foils are transferred to the position 8 and separated again into two individual foils at 9 and a rolling oil is applied from 10 to the inner surfaces of the separated foils of aluminum. Two aluminum foils are, thereafter, again doubled at 11 and pack-rolled by the rolls 12 in the same direction as that of the first pack rolling step with the suitable conditions somewhat different from the conditions of the first pack rolling step, for example slightly larger roll load or the like. Thus twice pack-rolled foils of aluminum are then separated into two thin foils of aluminum (not shown in Figures), each foils having a thickness of e.g. 7–80 μm and a matt surface with an excellent property such as a roughness of 0.20–0.65 μm $R_a$. The product foil of aluminum may be then subjected to annealing.

Thus obtained aluminum foil is then adhered by an adhesive to a support in any appropriate conventional manner such as extrusion, dry-lamination and the like to prepare a composite sheet of the invention as shown in FIG. 1. In the preparation of the composite sheet, the aluminum foil 2 is laminated on the support 1 so that the matt surface 2' of the foil is to be an outer side of the composite sheet as shown in FIG. 1.

Figure 3:
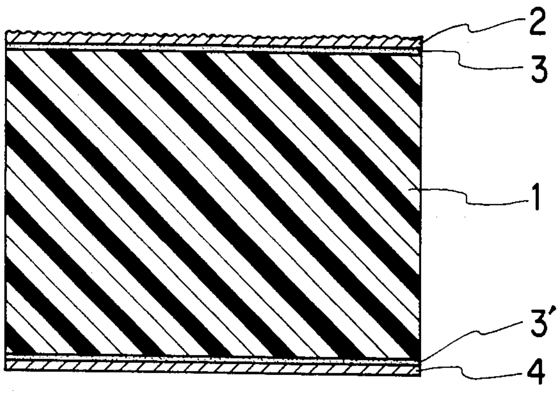
FIG. 3 shows another embodiment of the composite sheet of the invention.

In an another embodiment of the composite sheet of the present invention, in order to avoid curling and enhance the strength of the composite sheet of the invention, a metal reinforcing layer 4 may be provided by an adhesive layer 3' on the outer side of the support 1 as shown in FIG. 3. In this embodiment of the invention, the thickness of the aluminum foil 2 may be reduced to e.g. 7–40 μm. The metal reinforcing layer 4 may be a metal foil such as an aluminum or aluminum alloy foil prepared by a conventional method such as a conventional rolling process. The thickness of the metal reinforcing layer 4 may be 10–40 μm for example.

Figure 4:
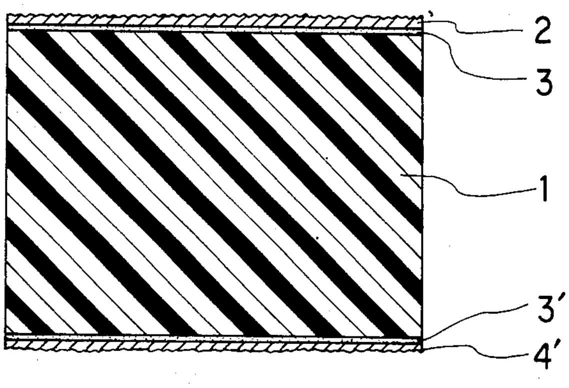
FIG. 4 shows a still another embodiment of the composite sheet for preparing a presensitized plate for both-side use.

In the present invention, the metal reinforcing layer 4 may be substituted with an another aluminum foil 4' having a matt surface, as shown in FIG. 4. From such a composite sheet a presensitized plate for both-side use can be prepared as hereinafter described.

The composite sheet of the present invention is very suitable for preparing a presensitized plate for lithography. It will be understood that the presensitized plate for lithographic printing to be prepared from the composite sheet of the invention may be also included within the scope of the present invention.

Figure 5:
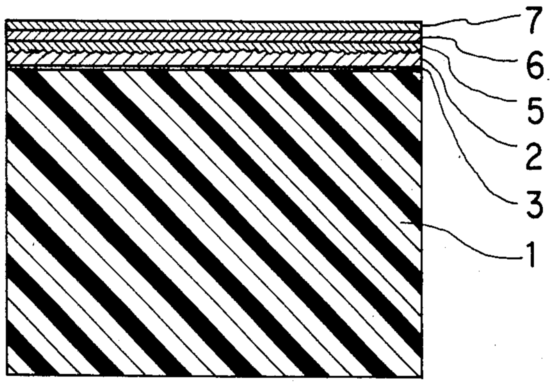
FIG. 5 shows a construction of an embodiment of the presensitized plate of the invention.

FIG. 5 shows one example of a construction of the presensitized lithographic printing plate of the present invention. The presensitized plate comprises the composite sheet of the invention, for example the composite sheet shown in FIG. 1, which has a support 1 and an aluminum foil 2 adhered by an adhesive layer 3 to the support 1, an anodized layer 5, an optionally mounted hygroscopic layer 6 (which may be omitted depending on the use and/or object of the presensitized plate to be prepared) and a photosensitive coating 7. The presensitized plate of the invention may be prepared by any conventional method.

The anodized layer 5 is provided on the matt surface 2' of the aluminum foil 2 by a conventional anodizing treatment. The thickness of the anodized layer 5 may be 0.5–2.0 μm. The hygroscopic layer 6 is provided, if desired, on the anodized layer 5, for example, by a treatment in an aqueous solution of sodium silicate. The thickness of the hygroscopic layer 6 may be 0.1–1.0 μm. The photosensitive coating 7 contains a photosensitive substance therein and is provided either directly on the anodized layer 5 or on the hygroscopic layer 6. The photosensitive substance to be used in the invention may be any conventional one known in the art, for example a positive-type substance such as o-quinone diazide or a negative-type substance such as diazonium salt, and may be selected according to the use and/or object of the presensitized plate. The thickness of the photosensitive coating 7 may be 0.5–5.0 μm.

As described hereinbefore, a presensitized plate for both-side use can be prepared from the composite sheet shown in FIG. 4 by providing an anodized layer, an optional hygroscopic layer and a photosensitive coating, in this order, on both matt surfaces of the aluminum foil in a similar manner to that mentioned above. It will be understood that the presensitized plate for both-side use may be also included within the scope of the present invention.

The presensitized lithographic printing plate of the present invention has an excellent printing property such as "printing runnability", that is, the plate of the invention shows a good endurance to ten thousand runs of printing operation and further in some cases fifty thousand or more runs while retaining other good printing properties, as shown in the following illustrative examples. The presensitized plate of the present invention may satisfy the economic requirements, and furthermore, the plate may be prepared without difficulty by using a conventional rolling mill.

The present invention will be illustrated in more detail by the following non-limitative examples. It will be understood, however, for those skilled in the art that various modifications may be applied to the present invention and such modifications will be also included within the scope of the present invention.

EXAMPLE 1: PREPARATION OF ALUMINUM FOIL

An aluminum strip (JIS A 1N30) of 0.3 mm in thickness and 1430 mm in width was subjected to the conventional rolling using a four-roll rolling mill (manufactured by Ishikawajima-Harima Heavy Industries Co., Ltd.) under the conventional conditions. After two times rolling, the obtained aluminum foil had a thickness of 85 μm in thickness and a surface roughness on both sides thereof of $R_a$=0.13 μm measured by SURF-COM 304 B (manufactured by Tokyo Seimitsu Co., Ltd.).

Two such prepared aluminum foils were doubled with the aid of kerosene as a rolling oil and subjected to the special pack rolling process of the invention under the conditions such as a roll load of 200 kg/mm, a rolling speed of 300 m/min, a reduction per pass of 55% and a winding tension of 3 kg/mm$^2$. The pack-rolled aluminum foils were separated into two individual aluminum foils, each of which had a thickness of 38 μm and a matt surface with a roughness of 0.17 μm $R_a$ on one side.

Two aluminum foils were again doubled with the aid of the rolling oil applied onto each inner surface of the aluminum foils and once more pack-rolled under the conditions such as a roll load of 210 kg/mm, a rolling speed of 600 m/min, a reduction per pass of 60.5% and a winding tension of 7.4 kg/mm$^2$.

The resultant aluminum foils after separating into two individual foils had a thickness of 15 μm and a matt surface with a roughness of 0.49 μm $R_a$ on one side.

EXAMPLE 2: PREPARATION OF COMPOSITE SHEET

A sheet of polyethylene terephthalate of 0.13 mm in thickness was laminated on the mirror surface of the aluminum foil prepared in Example 1 by applying polyethylene resin as an adhesive therebetween with extruder. Thus prepared composite sheet had a three-layer structure as shown in FIG. 1 and a thickness of the adhesive layer was 15 μm.

On the other hand, the same aluminum foil was used to prepare a composite sheet having a five-layer structure as shown in FIG. 3 by a dry-lamination method. The support was a film of oriented polypropylene with a thickness of 0.13 mm. In this five-layer composite sheet, an aluminum foil 4 of 20 μm in thickness was mounted on the other side as a metal reinforcing layer, which was prepared by a conventional rolling. The thickness of each adhesive layer 3 or 3' of polyurethane was 5 μm.

For comparison, two composite sheets of three-layer structure were prepared in a similar manner as above-mentioned from either the once pack-rolled aluminum foil of 38 μm in thickness and having a matt surface of 0.17 μm $R_a$ in roughness prepared in Example 1 or an aluminum foil of 20 μm in thickness and 0.05 μm $R_a$ in roughness prepared by a conventional rolling, by using a film of polyethylene terephthalate of 0.13 mm in thickness as a support.

EXAMPLE 3: PREPARATION OF PRESENSITIZED PLATE

Four composite sheets prepared in Example 2 were subjected to an anodizing treatment by using a 20% aqueous solution of sulfuric acid as an electrolyte at 30° C. and a current density of 2.5 A/dm$^2$. The thickness of the obtained anodized layer was 1 μm.

The anodized sheets were then subjected to a hygroscopic treatment by using a 2% aqueous solution of sodium silicate at 40° C. for 20 seconds. The thickness of the hygroscopic layer was 0.1 μm.

A diazo-type negative photosensitive material was coated in a thickness of about 1 μm on the hygroscopic layer of four sheets to obtain four presensitized plates, that is, a presensitized plate of the present invention prepared from the three-layer composite sheet (hereinafter referred to as PS plate 1 of the invention), a presensitized plate of the present invention prepared from the five-layer composite sheet (hereinafter referred to as PS plate 2 of the invention), a presensitized plate for comparison prepared from the once pack-rolled aluminum foil (hereinafter referred to as comparative PS plate 1) and a presensitized plate for comparison prepared from the conventionally rolled aluminum foil (hereinafter referred to as comparative PS plate 2).

EXAMPLE 4: PRINTING TEST

Four presensitized plates prepared in Example 3 were exposed through a negative film with an original test pattern to actinic ray by a conventional manner and developed to obtain four printing plates.

These printing plates were subjected to a printing test using a printing machine (manufactured by Komori Printing Machinery Co., Ltd., 1003 ×800 mm), wood free papers of 55 kg per 1000 sheets, an ink of DIC F gross 59 (blue, manufactured by DAINIPPON INK AND CHEMICALS, INC.) and a printing speed of 7000 sheets per hour.

The test results are shown in Table 1.

TABLE 1

| | invention | | comparative | |
|---|---|---|---|---|
| | PS plate 1 | PS plate 2 | PS plate 1 | PS plate 2 |
| resolving power (1) | 170, 5% | 170, 5 | 133, 5% | 100, 5% |
| ink adhesion on the surface of PS plate (2) | good | good | bad | bad |
| water reception (2) | good | good | bad | bad |
| reproduction of dot (2) | good | good | bad | bad |
| printing runnability | >50000 | >50000 | ≈2000 | ≈500 |

NOTE:
(1) lines per inch and % in ratio of dot-area
(2) estimated by naked eye

As shown in Table 1, the PS plates 1 and 2 of the invention showed good results in the printing test while the comparative PS plates 1 and 2 shows the inferior results.

EXAMPLE 5

Two aluminum foils of 30 μm in thickness prepared by the twice repeated pack rolling similar to Example 1 were laminated on both sides of a polyethylene terephthalate film of 100 μm in thickness by extrusion of polyethylene resin as an adhesive to obtain a five-layer composite sheet of the invention with a total thickness of 200 μm (see FIG. 4). The composite sheet had outer surfaces with a roughness of 0.55 μm $R_a$ measured by the same instrument for the measurement of surface roughness by the stylus method as in Example 1.

The composite aluminum sheet was subjected to anodizing treatment in a 20% aqueous solution of sulfuric acid as an electrolyte at 30° C. and a current density of 2.5 A/dm$^2$ to provide an anodized layer of about 0.8 μm in thickness on the matt surfaces of the aluminum foils. After washing with water and drying, a diazo-type negative photosensitive material was coated on the anodized layer by gravure printing in a thickness of about 0.9 μm to obtain a presensitized lithographic printing plate of the invention.

The presensitized plate was exposed through a negative film to actinic ray by a conventional manner, developed and subjected to a printing test in the same manner as Example 4. The good results were obtained.

In addition to the excellent printing properties, the presensitized plate of the invention showed no problem during the printing test and accordingly the presensitized plate was suitable for lithography.

EXAMPLE 6

Two aluminum foils of 25 μm in thickness with a matt surface of a roughness of 0.65 μm $R_a$ prepared by twice repeatedly pack rolling doubled two aluminum foils in a similar manner to Example 1 were laminated on both sides of a synthetic paper of polypropylene of 250 μm in thickness as an interlayer by the dry-lamination method using polyurethane adhesive to obtain a composite sheet of the invention with the matt surfaces facing outside.

A presensitized plate was prepared from the composite sheet in a similar manner as Example 5 and subjected to the same printing test as Example 5.

The test results were similar to the results of Example 5, and after 70000 runs of printing, the plate was still able to be subjected to printing without any change of printing results.

EXAMPLE 7

The same aluminum foil as used in Example 6 was laminated by the same adhesive as in Example 6 on one side of an oriented polypropylene film of 200 μm in thickness to prepare a composite sheet of three-layer structure with the matt surface of the aluminum foil facing outside as shown in FIG. 1.

The composite sheet was subjected to an anodizing treatment as described in Example 5 and a commercially available positive-type photosensitive material (novolack quinone diazide) was coated on the anodized plate with the thickness of about 1.7 μm. The thus obtained presensitized plate was then subjected to a printing test similar to those in Examples 5 and 6, and more than 50000 sheets of excellent printed matter were obtained.

EXAMPLE 8

Two aluminum foils of 15 μm in thickness with a matt surface of 0.4 μm $R_a$ in rougness prepared by twice repeatedly pack rolling doubled two aluminum foils in a similar manner as Example 1 were laminated by the dry-lamination using polyurethane adhesive on both sides of polyethylene terephthalate film of 50 μm in thickness to obtain a five-layer composite sheet of the invention with the matt surface facing outside.

A presensitized plate was prepared from the composite sheet by a similar manner as in Example 5 and subjected to the same printing test as Example 5.

The results were similar to those obtained in Example 5, and the printing operations was still able to continue after 50000 runs of the printing plate.

What is claimed is:

1. A composite sheet for a presensitized lithographic printing plate, comprising a support of a synthetic resin film and an aluminum foil thereon, said aluminum foil having a matt surface with a roughness of 0.20 to 0.65 μm$R_a$ on one surface thereof and a thickness of from 7 to 80 μm, said foil prepared by twice or more pack rolling doubled aluminum foils under the conditions of a roll load of 100 to 250 kg/mm, a rolling speed of 100 to 800 m/min and a reduction per pass of 20 to 65%, said aluminum foil positioned on said support so that the matt surface thereof faces outside.

2. A method for producing a composite sheet for a presensitized lithographic printing plate, comprising subjecting doubled aluminum foils to the pack rolling process twice or more under the conditions of a roll load of 100 to 250 kg/mm, a rolling speed of 100 to 800 m/min and a reduction per pass of 20 to 65% to obtain an aluminum foil with a matt surface with a roughness of 0.20 to 0.65 $\mu mR_a$ on one surface thereof and a thickness of from 7 to 80 $\mu m$, and adhering said aluminum foil to a support of a synthetic resin film.

3. The composite sheet of claim 1, in which the synthetic resin film is a sheet of polyethylene terephthalate, oriented polypropylene, polypropylene or polyethylene.

4. The composite sheet of claim 1 or 3, further comprising a metal reinforcing layer on the other side of the support.

5. The composite sheet of claim 4, in which the metal reinforcing layer is an aluminum foil having a thickness of 10–40 $\mu m$.

6. The composite sheet of claim 1 or claim 2 further comprising another aluminum foil which has a matt surface with a roughness of 0.20–0.65 $\mu mR_a$ on one side thereof and is prepared by twice or more pack rolling doubled aluminum foils under the conditions of a roll load 100 to 250 kg/mm, a rolling speed of 100 to 800 m/min and a reduction per pass of 20 to 65%, the support being interposed between two aluminum foils so that each matt surface of the aluminum foils faces outward.

7. A lithographic printing plate comprising a composite sheet of claims 1, 3, 4, 5 or 6, an anodized layer on the matt surface of the aluminum foil and a photosensitive coating on the anodized layer.

8. The lithographic printing plate of claim 7, further comprising a hygroscopic layer between the anodized layer and the photosensitive coating.

* * * * *